US008144466B2

United States Patent
Kishimoto et al.

(10) Patent No.: US 8,144,466 B2
(45) Date of Patent: Mar. 27, 2012

(54) FAN UNIT AND ELECTRONIC APPARATUS INCLUDING THE SAME

(75) Inventors: Kazutaka Kishimoto, Kitakyushu (JP); Makoto Kojyo, Kitakyushu (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 134 days.

(21) Appl. No.: 12/782,711

(22) Filed: May 19, 2010

(65) Prior Publication Data

US 2010/0296246 A1    Nov. 25, 2010

(30) Foreign Application Priority Data

May 20, 2009   (JP) ................................ 2009-122428
Nov. 25, 2009  (JP) ................................ 2009-267688

(51) Int. Cl.
   H05K 7/20    (2006.01)
   H05K 5/00    (2006.01)
(52) U.S. Cl. ..................... 361/695; 361/694; 454/184
(58) Field of Classification Search .......... 361/694–695; 454/184
   See application file for complete search history.

(56) References Cited

U.S. PATENT DOCUMENTS

| | | | | |
|---|---|---|---|---|
| 4,774,631 A * | 9/1988 | Okuyama et al. ............ 361/695 |
| 5,854,738 A | 12/1998 | Bowler |
| 6,074,296 A * | 6/2000 | Wu ................................ 454/184 |
| 6,392,872 B1 * | 5/2002 | Doustou et al. .......... 361/679.48 |
| 7,481,704 B2 * | 1/2009 | Kao et al. ....................... 454/184 |
| 7,701,710 B2 * | 4/2010 | Tanaka et al. ............. 361/679.5 |
| 7,771,165 B2 * | 8/2010 | Chen .......................... 415/213.1 |
| 2004/0136872 A1 * | 7/2004 | Miller et al. .................... 422/83 |
| 2007/0053160 A1 | 3/2007 | Chen |
| 2007/0076368 A1 * | 4/2007 | Pike et al. ...................... 361/687 |
| 2008/0107479 A1 | 5/2008 | Yang |
| 2008/0130217 A1 * | 6/2008 | Chen ............................. 361/685 |
| 2009/0116189 A1 * | 5/2009 | Chang et al. .................. 361/695 |

FOREIGN PATENT DOCUMENTS

| | | |
|---|---|---|
| JP | 2000-232288 | 8/2000 |
| JP | 2008-135422 | 6/2008 |

OTHER PUBLICATIONS

Extended European Search Report for corresponding EP Application No. 10163286.7-1242, Feb. 23, 2011.

* cited by examiner

Primary Examiner — Gregory Thompson
(74) Attorney, Agent, or Firm — Ditthavong Mori & Steiner, P.C.

(57) ABSTRACT

A fan unit holds a cooling fan and is detachable from a main body of an inverter apparatus. The fan unit is provided with a fan-unit retainer plate having keyhole-shaped apertures and provided between an upper case and a lower case. The fan unit is fixed by pressing the fan-unit retainer plate with fixing screws. The fan unit is easily and reliably removed by moving the fan-unit retainer plate without directly moving the fan unit and without removing the fixing screws.

10 Claims, 4 Drawing Sheets

US 8,144,466 B2

FAN UNIT AND ELECTRONIC APPARATUS INCLUDING THE SAME

CROSS-REFERENCE TO RELATED APPLICATION

The present application is related to Japanese Patent Applications No. 2009-122428, filed May 20, 2009, and 2009-267688, filed Nov. 25, 2009. The contents of these applications are incorporated herein by reference in their entirety.

BACKGROUND OF THE INVENTION

1. Field of the Invention

The present invention relates to a fan unit.

2. Description of the Related Art

For example, in an inverter apparatus disclosed in Japanese Unexamined Patent Application Publication No. 2008-135422 that was published Jun. 12, 2008, heating elements, such as an insulate gate bipolar transistor (IGBT) that generates a high heat, a capacitor, and a reactor, are incorporated in a housing. A heat sink is used to cool these elements, and a cooling fan for forced air cooling is mounted at one end of the housing.

When the capacity of the inverter apparatus is small and only one cooling fan will do, a fan case is attached to the housing by engagement of projections without using any fixing screw. In contrast, when the capacity of the inverter apparatus is large and a plurality of cooling fans are used, the fan case is firmly attached to the housing with fixing screws.

SUMMARY OF THE INVENTION

A fan unit according to an aspect of the present invention includes an upper fan case and a lower fan case stacked and fixed to each other, each of the upper and lower fan cases including at least one cooling fan, the lower fan case including a flange portion to be placed on a fan-unit support member having threaded holes, the flange portion having a plurality of screw passage holes having a diameter larger than a diameter of a head of a fixing screw; and a fan-unit retainer plate slidably placed on an upper surface of the flange portion of the lower fan case, the fan-unit retainer plate having screw passage holes each including a first hole having a diameter smaller than the diameter of the head of the fixing screw and a second hole having a diameter larger than the diameter of the head of the fixing screw.

BRIEF DESCRIPTION OF THE DRAWINGS

The present invention will be described in further detail with reference to the accompanying drawings wherein.

DETAILED DESCRIPTION OF THE EMBODIMENTS

Figure 1:
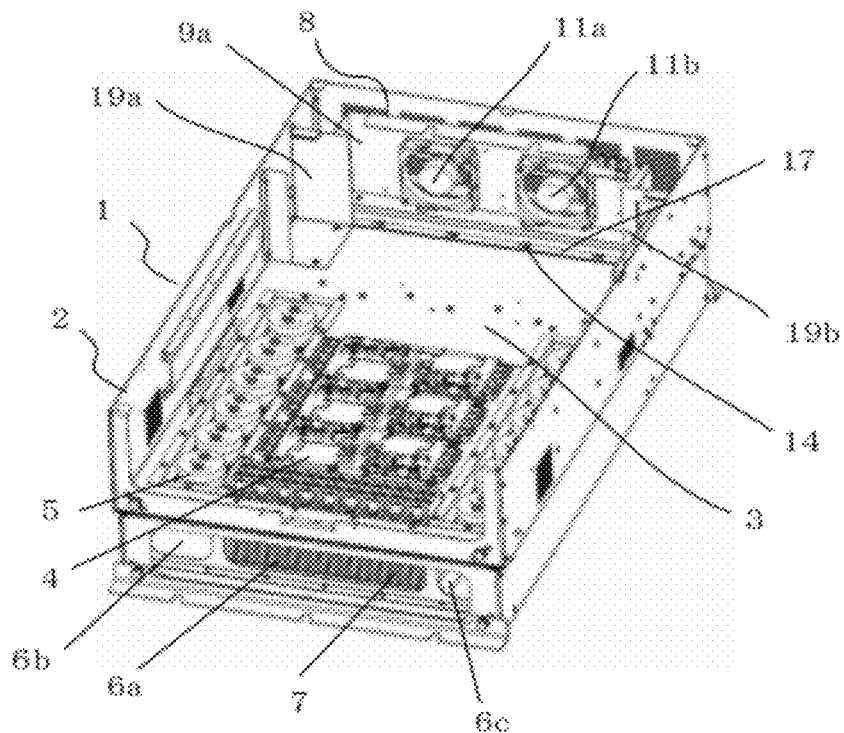
FIG. 1 is a perspective view of an inverter apparatus according to an embodiment of the present invention.
Figure 2:
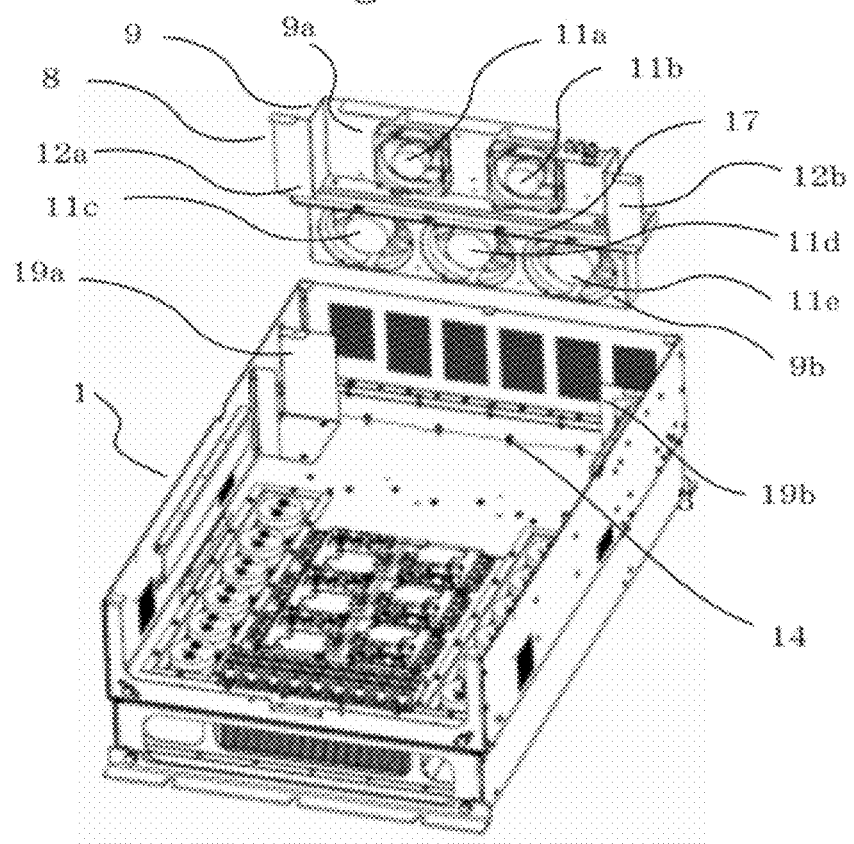
FIG. 2 is a perspective view of the inverter apparatus shown in FIG. 1, from which a fan unit is detached.
Figure 3:
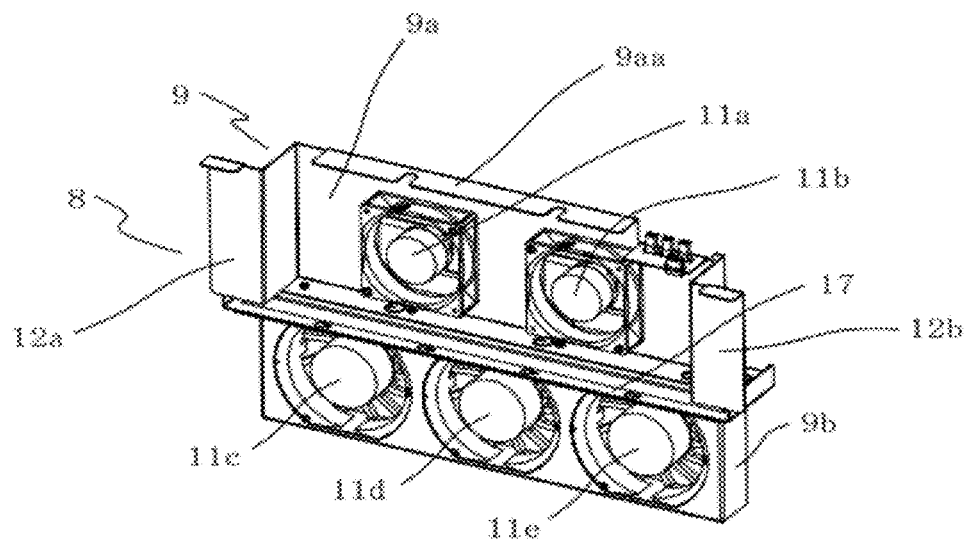
FIG. 3 is a perspective view of the fan unit shown in FIG. 2.
Figure 4:
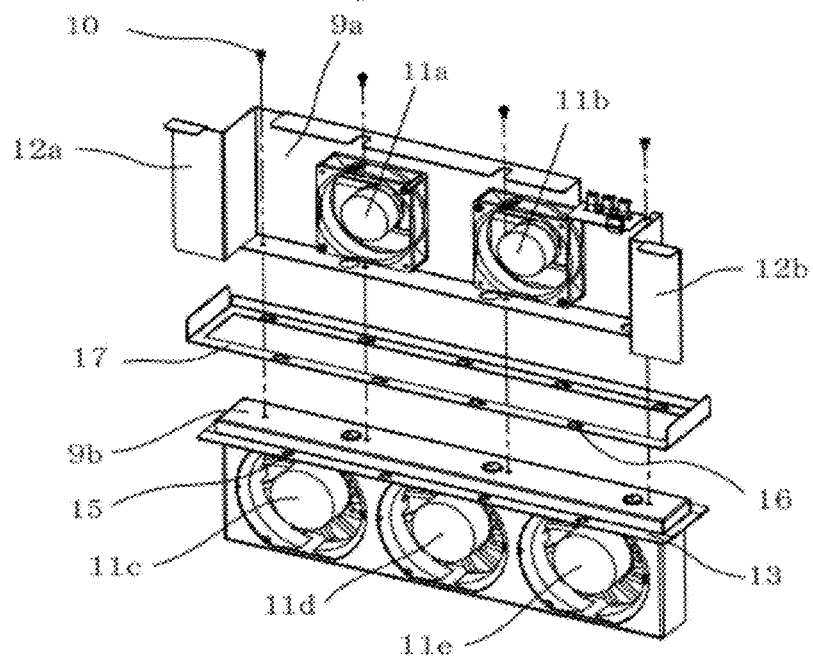
FIG. 4 is an exploded perspective view of the fan unit shown in FIG. 3.
Figure 5:
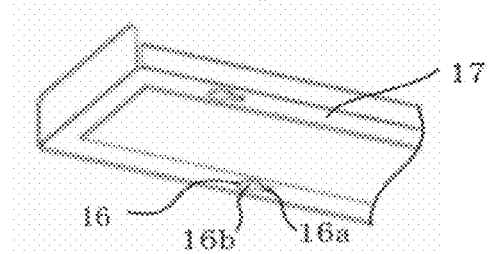
FIG. 5 is an enlarged perspective view illustrating the principal part of a fan-unit retainer plate shown in FIG. 4.

An embodiment of the present invention will be described below with reference to the drawings. While the present invention is applied to an inverter apparatus in this embodiment, the invention is similarly applicable to other electronic apparatuses such as a converter apparatus and a servo amplifier apparatus.

Referring to FIGS. 1 to 8, an inverter apparatus 1 includes a housing 2 defined by two upper and lower parts. Heating elements 4, such as an IGBT, mounted on a printed board 3, capacitors 5 projecting downward, etc. are provided in the upper part of the housing 2, and air channels 6a, 6b, and 6c are provided in the lower part of the housing 2. In the air channel 6a, a heat sink 7 is provided in tight contact with the heating elements 4. The capacitors 5 project downward from the upper part of the housing 2 into the air channels 6b and 6c.

A fan unit 8 blows cooling air into the inverter apparatus 1. The fan unit 8 is attached to one end of the housing 2 serving as a fan-unit support member, and includes a fan case 9 and cooling fans 11a, 11b, 11c, 11d, and 11e. The fan case 9 is divided into an upper fan case 9a and a lower fan case 9b corresponding to the upper and lower parts of the housing 2. The upper fan case 9a and the lower fan case 9b are stacked and fixed to each other with fixing screws 10. For example, two cooling fans 11a and 11b are arranged side by side in the right-left direction in the upper fan case 9a, and three fan cases 11c, 11d, and 11e are arranged side by side in the right-left direction in the lower fan case 9b. Guides 12a and 12b shaped like flat plates are respectively provided on left and right sides of the upper fan case 9a, and serve to guide attachment and detachment of the fan unit 8.

The lower fan case 9b has a flange portion 13 to be placed on a portion of the housing 2 having threaded holes. This flange portion 13 is provided on the periphery of the lower fan case 9b, and has a plurality of screw passage holes 15 having a diameter larger than the diameter of the heads of the fixing screws 14. A fan-unit retainer plate 17 is slidably provided on an upper surface of the flange portion 13 of the lower fan case 9b. The fan-unit retainer plate 17 has screw passage holes, for example, keyhole-shaped apertures 16 each defined by a first hole 16a having a diameter smaller than the diameter of the heads of the fixing screws 14 and a second hole 16b having a diameter larger than the diameter of the heads of the fixing screws 14. The fan-unit retainer plate 17 has an annular rectangular shape corresponding to the flange portion 13 provided on the periphery of the lower fan case 9b.

The housing 2 of the inverter apparatus 1 forms the fan-unit support member. At one end of the housing 2 serving as the fan-unit support member, a rectangular opening 18 having a shape corresponding to the shape of the fan unit 8 is provided.

On left and right sides of the rectangular opening 18 of the housing 2, support members 19a and 19b are provided to fix the guides 12a and 12b provided at the left and right sides of the upper fan case 9a of the fan unit 8.

By being fixed to the housing 2 with the fixing screws 14, the fan-unit retainer plate 17 of the fan unit 8 housed in the inverter apparatus 1 holds the lower fan case 9b down, so that the fan unit 8 is held in the inverter apparatus 1.

In the above-described configuration, the fan unit 8 is detached from the inverter apparatus 1 in the following manner.

Figure 6A:
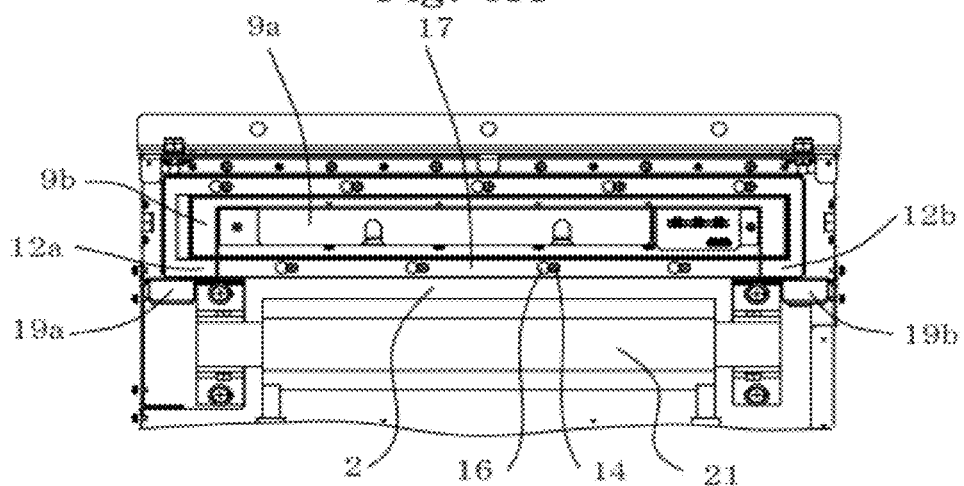
FIG. 6A is a plan view illustrating the principal part of the inverter apparatus shown in FIG. 1 to which the fan unit is attached.
Figure 6B:
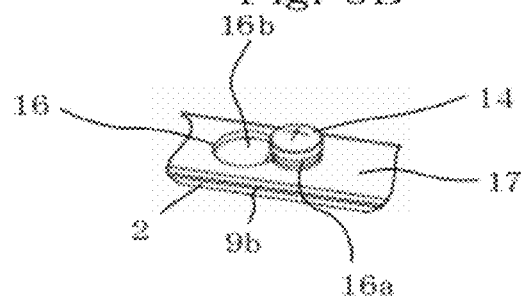
FIG. 6B is a perspective view of a fixing screw in a state shown in FIG. 6A.
Figure 6C:
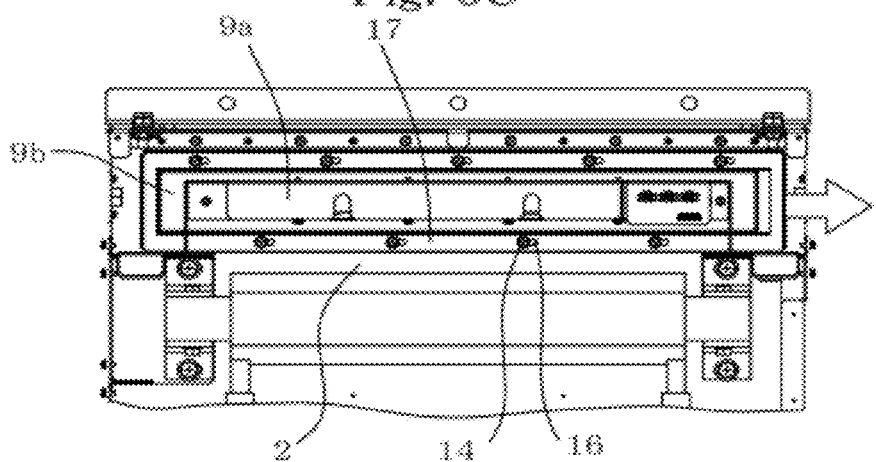
FIG. 6C is a plan view illustrating a state in which the fan unit is slid for detachment.
Figure 6D:
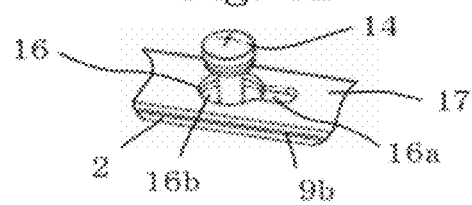
FIG. 6D is a perspective view illustrating the fixing screw in the state shown in FIG. 6C.

First, the fixing screws 14 are loosened sufficiently. In this case, it is unnecessary to completely remove the fixing screws 14. Next, as shown in FIG. 6C, the fan-unit retainer plate 17 is slid to the right while being in contact with the lower fan case 9b, and is placed at a position where the large-diameter second holes 16b of the keyhole-shaped apertures 16 provided in the fan-unit retainer plate 17 are aligned with the fixing screws 14, as shown in FIG. 6D.

After confirming that the fan-unit retainer plate 17, the lower fan case 9b, and the fixing screws 14 do not interfere with one another, the user pulls the fan unit 8 forward while holding a protruding edge 9aa provided in the upper fan case 9a of the fan unit 8, so that the fan unit 8 can be detached from the inverter apparatus 1. The fan unit 8 is attached by the reverse procedure.

The fan unit 8 housed in the inverter apparatus 1 has the above-described configuration, and therefore has the following operational advantages:

(1) Since the fan case 9 does not directly have any keyhole-shaped aperture, the heavy fan unit 8 does not need to be slid during attachment and detachment. This allows the fan unit 8 to be attached and detached with a small force.

(2) Since the fan unit 8 is not slid, there is no need to ensure a space where the fan unit 8 slides. This achieves size reduction of the inverter apparatus 1.

(3) Since the fan unit 8 can be attached and detached without removing the fixing screws 14, the fixing screws 14 will not fall into the inverter apparatus 1 or will not be lost. This allows the fan unit 8 to be reliably attached and detached in a short time.

The holes provided in the fan-unit retainer plate 17 are not limited to the keyhole-shaped apertures 16, and for example, may be slots or semicircular holes. In this case, it is also possible to slide the fan-unit retainer plate 17 and to attach and detach the fan unit 8 simply by loosening the fixing screws 14 without completely removing the fixing screws 14.

Figure 7:
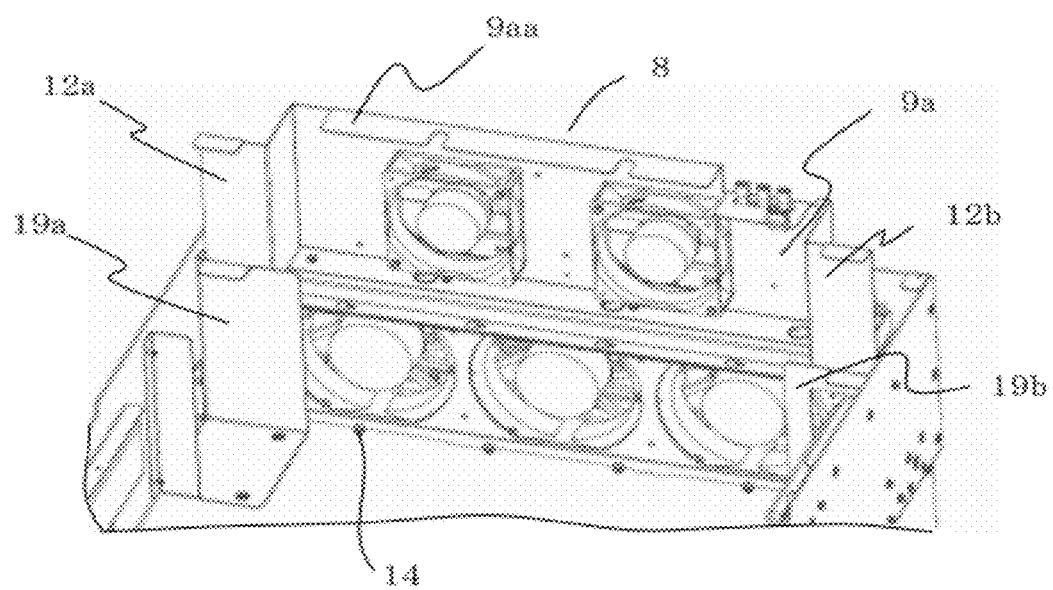
FIG. 7 is a perspective view illustrating a state in which the fan unit is being detached from the inverter apparatus shown in FIG. 1.

As shown in FIG. 7, a part of the upper fan case 9a forms the guides 12a and 12b shaped like flat plates. The guides 12a and 12b are in contact with the support members 19a and 19b of the housing 2 so as to guide attachment and detachment of the fan unit 8. Hence, the fan unit 8 can be attached and detached easily and reliably.

Figure 8:
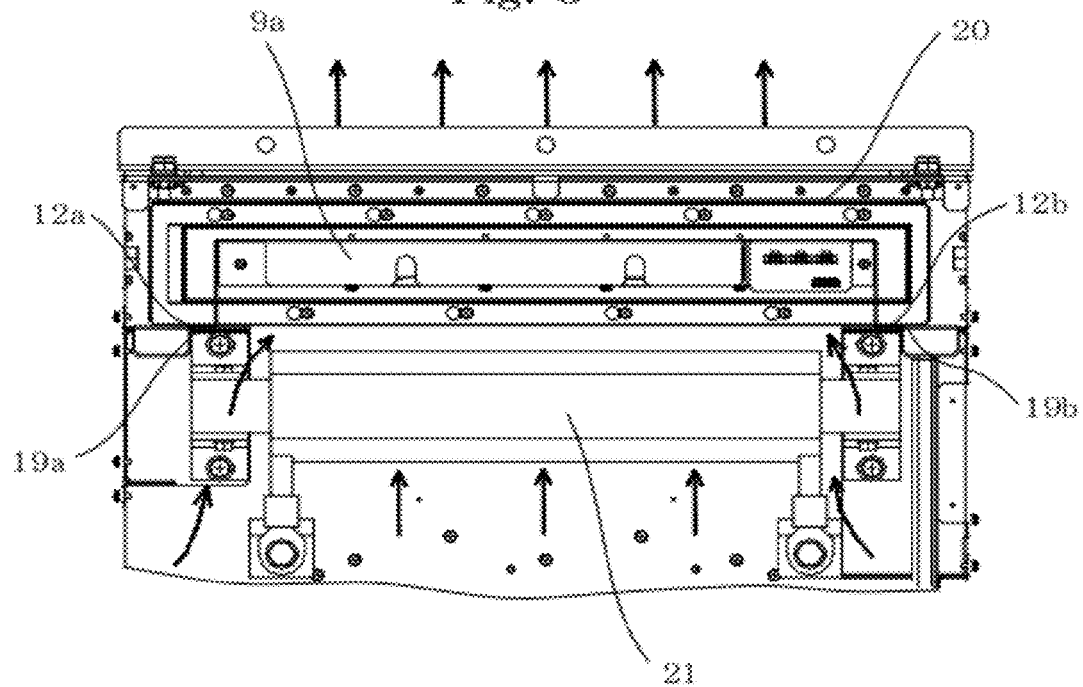
FIG. 8 is a plan view illustrating formation of an air channel in the fan unit of the inverter apparatus shown in FIG. 1.

As shown in FIG. 8, an air channel 20 is formed by fixing the guides 12a and 12b to the support members 19a and 19b. This can efficiently cool an adjacent reactor 21 serving as a heating element.

The inverter apparatus 1 is attached to a control panel or the like (not shown) in a manner such that the fan unit 8 is provided on the upper side and the heat sink 7 is provided on the rear side.

While the flange portion 13 is provided in the lower fan case 9b in the above-described embodiment, it may be provided in the upper fan case 9a.

What is claimed is:

1. A fan unit comprising:
    an upper fan case and a lower fan case stacked and fixed to each other, each of the upper and lower fan cases including at least one cooling fan, the lower fan case including a flange portion to be placed on a fan-unit support member having threaded holes, the flange portion having a plurality of screw passage holes having a diameter larger than a diameter of a head of a fixing screw; and
    a fan-unit retainer plate slidably placed on an upper surface of the flange portion of the lower fan case, the fan-unit retainer plate having screw passage holes each including a first hole having a diameter smaller than the diameter of the head of the fixing screw and a second hole having a diameter larger than the diameter of the head of the fixing screw.

2. The fan unit according to claim 1, wherein the screw passage holes provided in the fan-unit retainer plate are keyhole-shaped apertures.

3. The fan unit according to claim 1, wherein the flange portion is provided on a periphery of the lower fan case.

4. The fan unit according to claim 3, wherein the fan-unit retainer plate has an annular rectangular shape corresponding to the flange portion provided on the periphery of the lower fan case.

5. The fan unit according to claim 1, wherein guides shaped like flat plates are provided at right and left sides of the upper fan case, and the guides guide attachment and detachment of the fan unit.

6. The fan unit according to claim 5, wherein the guides are L-shaped in top view in a manner such that the upper fan case forms an air channel.

7. An electronic apparatus comprising a fan unit, wherein the fan unit includes:
    an upper fan case and a lower fan case stacked and fixed to each other, each of the upper and lower fan cases including at least one cooling fan, the lower fan case including a flange portion to be placed on a fan-unit support member having threaded holes, the flange portion having a plurality of screw passage holes having a diameter larger than a diameter of a head of a fixing screw; and
    a fan-unit retainer plate slidably placed on an upper surface of the flange portion of the lower fan case, the fan-unit retainer plate having screw passage holes each including a first hole having a diameter smaller than the diameter of the head of the fixing screw and a second hole having a diameter larger than the diameter of the head of the fixing screw.

8. The electronic apparatus according to claim 7, wherein a housing of the electronic apparatus forms the fan-unit support member, and the fan-unit support member has a rectangular opening shaped in correspondence with a shape of the flange portion of the lower fan case of the fan unit.

9. The electronic apparatus according to claim 8, wherein support members configured to fix guides provided at right and left sides of the upper fan case of the fan unit are provided on right and left sides of the rectangular opening of the housing of the fan-unit support member.

10. An electronic apparatus comprising:
    a housing;
    a fan unit attached to the housing; and
    a reactor provided on the housing, wherein the fan unit includes
an upper fan case and a lower fan case stacked and fixed to each other, each of the upper and lower fan cases including at least one cooling fan, the lower fan case including a flange portion to be placed on a fan-unit support member having threaded holes, the flange portion having a plurality of screw passage holes having a diameter larger than a diameter of a head of a fixing screw, and
a fan-unit retainer plate slidably placed on an upper surface of the flange portion of the lower fan case, the fan-unit retainer plate having screw passage holes each including a first hole having a diameter smaller than the diameter of the head of the fixing screw and a second hole having a diameter larger than the diameter of the head of the fixing screw,
wherein guides shaped like flat plates are provided at right and left sides of the upper fan case so as to guide attachment and detachment of the fan unit, and are L-shaped in top view in a manner such that the upper fan case forms an air channel, and
wherein the reactor is provided near the air channel.

* * * * *